(12) United States Patent
Strittmatter et al.

(10) Patent No.: US 8,023,546 B2
(45) Date of Patent: Sep. 20, 2011

(54) SEMICONDUCTOR LASER WITH INTEGRATED CONTACT AND WAVEGUIDE

(75) Inventors: Andre Strittmatter, Menlo Park, CA (US); Christopher L. Chua, San Jose, CA (US); Noble M. Johnson, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 12/564,302

(22) Filed: Sep. 22, 2009

(65) Prior Publication Data

US 2011/0069730 A1 Mar. 24, 2011

(51) Int. Cl.
*H01S 5/00* (2006.01)
(52) U.S. Cl. .................. 372/46.014; 372/45.01; 257/14
(58) Field of Classification Search .............. 372/45.01, 372/46.014
See application file for complete search history.

(56) References Cited

U.S. PATENT DOCUMENTS

| | | | | |
|---|---|---|---|---|
| 5,920,586 A * | 7/1999 | Nagai | ......................... | 372/46.01 |
| 6,463,088 B1 * | 10/2002 | Baillargeon et al. | ........ | 372/46.01 |
| 6,501,783 B1 * | 12/2002 | Capasso et al. | ................. | 372/96 |
| 7,123,637 B2 | 10/2006 | Kneissl et al. | | |
| 2005/0279994 A1 * | 12/2005 | Ueda et al. | ...................... | 257/33 |
| 2007/0098030 A1 * | 5/2007 | Ha et al. | ...................... | 372/43.01 |
| 2008/0240189 A1 * | 10/2008 | Takagi | ....................... | 372/43.01 |

OTHER PUBLICATIONS

Sirtori et al., Long-wavelength (lamba approx. 8-11.5 micro-m) semiconductor lasers with waveguides based on surface plasmons, Optics Ltrs., vol. 23, No. 17, pp. 1366 et seq. (Sep. 1, 1998).
Uchida et al., Recent Progress in High-Power Blue-Violet Lasers, IEEE J. Quant. Elec., vol. 9, No. 5, pp. 1252 et seq. (Sep./Oct. 2003).
Gupta, M.C., Handbook of Photonics, Fig. 3.21.

* cited by examiner

*Primary Examiner* — Tod T Van Roy
(74) *Attorney, Agent, or Firm* — Jonathan A. Small

(57) ABSTRACT

A semiconductor light-emitting device has, in place of a traditional separate cladding layer and contact structure, a non-epitaxial contact and waveguide layer. The non-epitaxial contact and waveguide layer is formed of a conductive material and such that it has a recess therein and over the injection region. Air filling the region together with appropriate choice of material for the non-epitaxial contact and waveguide layer creates desired lateral waveguiding. Metallic silver in one choice for this material. The recess may also be filled with a low-loss material having a refractive index higher than that of the material forming the non-epitaxial contact and waveguide layer. Transparent conductive oxides (e.g., indium tin oxide (ITO), zinc oxide (ZnO), etc.), appropriate metal (e.g., gold), or a composite comprising a conductive oxide and a metal, provide low absorption in the UV and near-IR wavelengths of interest, and are thus good candidate materials for within the recess.

5 Claims, 3 Drawing Sheets

SEMICONDUCTOR LASER WITH INTEGRATED CONTACT AND WAVEGUIDE

STATEMENT REGARDING FEDERALLY SPONSORED RESEARCH AND DEVELOPMENT

The U.S. Government has a fully paid-up license in this disclosure and the right in limited circumstances to require the patent owner to license others on reasonable terms as provided for by the terms of contract number W911NF-08-C-0003 awarded by DARPA-VIGIL.

BACKGROUND

The present disclosure is related to solid state laser devices, and more specifically to ridge waveguide semiconductor lasers.

Modern semiconductor lasers, such as that shown in FIG. 5, are typically a series of layers comprising: a lower contact 102, a substrate and lower cladding 104, a lower waveguide layer 106, an active layer 108, an upper waveguide layer 110, an upper cladding layer 112, and an upper contact 114 which is separated in part from the upper cladding layer 112 by patterned insulator 116. Lateral end faces (in a plane generally perpendicular to the plane of the active layer 108) are formed to have semi-reflective mirror-like surfaces. Light is generated within the active layer, which is reflected between the semi-reflective mirrored end faces to ultimately produce a coherent laser output L which exits through at least one of the end faces.

In order to confine the light within the optical cavity of the structure so that stimulated emission can take place, the materials of the cladding layers 104, 112 are chosen to have an index of refraction which is lower than the index of refraction of the materials forming waveguide layers 106, 110 and active layer 108. Thus, the interfaces of the waveguide layers and the cladding layers are essentially mirrors, confining the light to the active layer. This is referred to as transverse confinement, since it confines the light in a direction transverse to the optical axis, i.e., the axis of the light beam ultimately emitted by the structure.

To confine the light within the structure in a lateral direction, i.e., within the plane of the active layer but still perpendicular to the optical axis of the device, a relative lowering of the refractive index (index guiding) at the lateral boundaries of the semiconductor laser structure may be provided. The lowering of the refractive index can be achieved either by etching the outer part of the semiconductor layers or by inducing an index change of the outer semiconductor material (e.g., implantation-induced disorder of quantum wells).

In one class of semiconductor light-emitting devices, referred to as ridge waveguide lasers, the lateral dimensions of parts of the upper layers 110, 112, and 114 are limited, either physically or functionally, for example by way of patterning and etching. Additionally, an underlayer, such as patterned underlying insulator 116 with a lower refractive index than semiconductor layers 106-112 may be used to confine the electrical injection to the so defined portion of the semiconductor structure. In certain embodiments such as shown in FIG. 5, when viewed in cross section this appears as a ridge (or stripe) 118 of width w running parallel to the optical axis. In the plane of the active region, light generation is thereby confined in what is referred to as the injection region by index guiding (i.e., the refractive index of the injection region, e.g. below the upper contact ridge 118, is larger than in adjacent regions below underlying insulator layer 116).

Recently, various non-epitaxial, conductive materials have been explored for use as the upper cladding layer. The problems being addressed by these non-traditional, conductive materials include that certain combinations of semiconductor waveguide layer materials 110 and cladding layer materials 112 have relatively low refractive index differences, are difficult to grow epitaxially upon each other without adversely affecting active layer quality and device performance, and/or are difficult to make electrically conductive. Silver, in particular, has been suggested as a material of interest for the upper cladding layer. See, for example, U.S. patent application Ser. No. 12/237,106, filed Sep. 24, 2008, which is incorporated herein by reference.

Conductive materials in general contribute to losses in semiconductor lasers by way of free carrier absorption mechanisms. In order to minimize such losses the penetration of the optical wave into a conductive cladding layer must be minimized. Therefore, the refractive index difference between the conductive cladding layer material and the waveguide material 110 needs to be as large as possible, e.g., a very low real part of the refractive index of the cladding layer is required. Known conductive materials having a very low real part of the refractive index in the visible spectrum (or portions thereof) of are for example silver (Ag), gold (Au), and aluminum (Al).

One problem still to be addressed is use of the non-epitaxial conductive cladding layer without an intervening reflective layer so that it may act as both a lateral waveguide and ohmic contact. The real portion of the refractive index of silver, for example, is lower than that of most other materials and in particular lower than that of air and other commonly used insulating materials ($SiO_2$, $Si_3N_4$ etc.) in the ultraviolet (UV) to near-infrared (IR) spectral range. However, lateral mode guiding occurs at the location of the laterally highest effective refractive index, which would not be below the contact structure in the case of a uniform non-epitaxial conductive cladding layer. The effective refractive index is given by the weighted sum of the refractive indices of all constituent materials including air. The relative contributions to the effective refractive index are defined by the penetration depth of the light into each material as seen from the semiconductor laser structure. Since the same applies to the effective absorption in the contact layers, the absorption of any material involved must be low at the wavelength of interest.

A non-epitaxially, conductive cladding layer with refractive index lower than air and other insulating materials formed to have a traditional ridged structure cannot, therefore, provide adequate optical confinement over the injection region. Thus, there is a need in the art for a technique to provide a silver cladding layer with an increased index of refraction so that it may function both as a refractive index waveguide and as an ohmic contact for edge-emitting laser diodes and similar devices, with minimal specialized processing requirements.

SUMMARY

Accordingly, the present disclosure is directed to a contact structure for a laser diode or the like of a material with lower refractive index than air, which provides lateral index waveguiding in addition to vertical optical waveguiding. Generally, the contact structure is formed to have an increased effective refractive index in the region above the injection region of a laser diode as compared to the regions laterally adjacent the injection region.

According to one aspect of the disclosure, a semiconductor laser diode is formed of a substrate, semiconductor laser structure (lower cladding, lower waveguide, active layer, and upper waveguide) together with a very thin, patterned insulating layer. A non-epitaxial conductive layer, for example silver, indium tin oxide (ITO), or silver-palladium-copper (Ag—Pd—Cu) is formed over the upper waveguide, and makes direct electrical and physical contact with the upper waveguide except in those regions in which the patterned insulating layer is disposed therebetween. A recess is formed in the non-epitaxial layer directly above the injection region. An air-filled gap is therefore provided which increases the effective refractive index over the injection region, particularly as compared to the laterally adjacent regions of the non-epitaxial layer. In this way, a low optical loss region is provided over the injection region, which can therefore serve both as an electrical contact and as a lateral waveguide.

According to a second aspect of the disclosure, the recess of the above embodiment is filled with a conductive, low-loss material having a higher refractive index than the non-epitaxial layer over the injection region. Low resistance of the contact and heat dissipation are thereby provided in addition to the non-epitaxial layer over the injection region serving both as an electrical contact and as a lateral waveguide.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well known starting materials, processing techniques, components, equipment and other well known details are merely summarized or are omitted so as not to unnecessarily obscure the details of the present invention. Thus, where details are otherwise well known, we leave it to the application of the present invention to suggest or dictate choices relating to those details.

Figure 1:
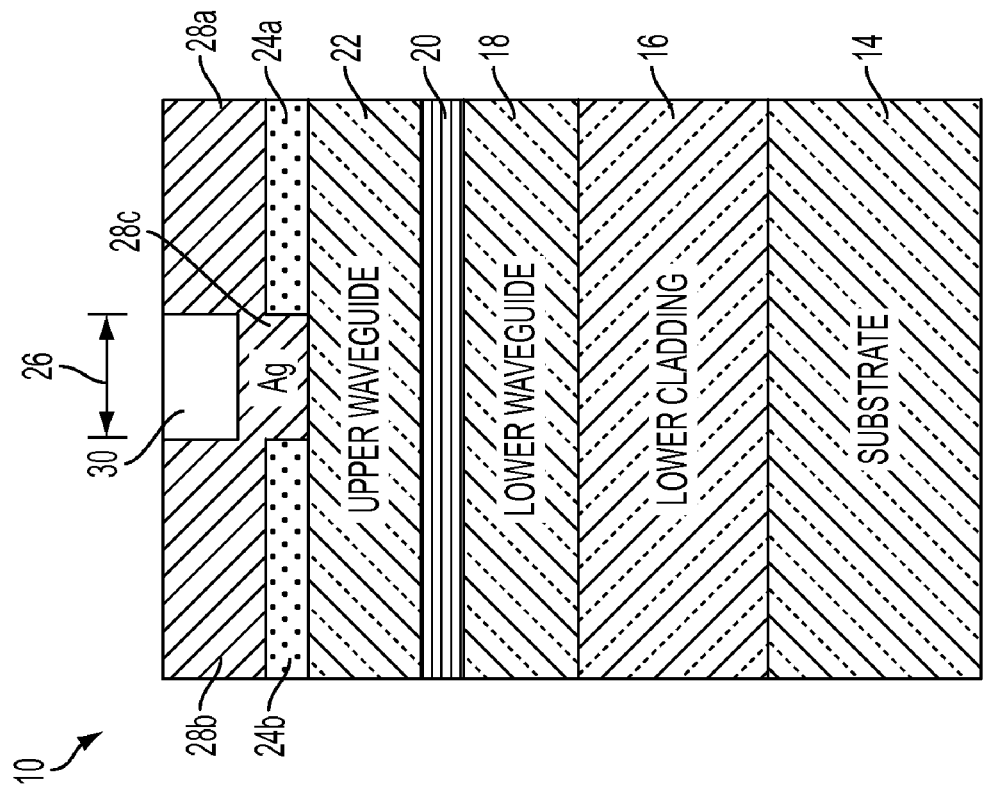
FIG. 1 is a cross-section of a semiconductor light-emitting device including a non-epitaxial, conductive layer having an unfilled recess therein over the injection region to provide a low optical loss region and permit the non-epitaxial, conductive layer to function both as a lateral waveguide and as an ohmic contact according to one embodiment of the present invention.

With reference now to FIG. 1, there is shown therein a first embodiment 10 of a semiconductor laser structure. While fewer or greater numbers of layers, or alternative layer compositions are contemplated by the present disclosure, embodiment 10 comprises a substrate 14 such as sapphire ($Al_2O_3$) or gallium nitride (GaN), lower crystalline semiconductor cladding layer 16 such as AlGaN, lower crystalline semiconductor waveguide layer 18 such as n-$In_xGa_{1-x}N$, multiple quantum well (MQW) active layer 20 such as multiple layers of $In_xGa_{1-x}N$, and upper crystalline semiconductor waveguide layer 22 such as p-$In_xGa_{1-x}N$. An optional GaN template layer (not shown) may also be provided between substrate 14 and lower cladding layer 16. Active layer 20 may optionally be embedded in a bulk or short-period superlattice $In_xGa_{1-x}N$/GaN separate confinement heterostructure (SCH), not shown. The precise ratios comprising the layers will be a matter of design choice. However, an exemplary structure may include:

TABLE 1

| Layer composition | Index, n |
|---|---|
| $In_{0.10}Ga_{0.90}N$ p-SCH | 2.456 |
| (15 nm) $In_{0.05}Ga_{0.95}N$ p-type | 2.44 (15 nm) |
| (4 × 3 nm) $In_{0.27}Ga_{0.73}N$ QWs | 2.54 (3 nm) |
| (5 × 7 nm) $In_{0.12}Ga_{0.88}N$ barrier | 2.463 (7 nm) |
| $In_{0.10}Ga_{0.90}N$ n-SCH | 2.456 |
| $Al_{0.07}Ga_{0.93}N$ clad | 2.41 |
| GaN | 2.426 | evaluated at wavelength λ = 500 nm

An insulating layer 24 such as silicon dioxide ($SiO_2$) of 5 nm thickness is next provided above the entire surface of upper waveguide 22 surface. Such layer may be formed using PECVD or electron-beam evaporation. The insulating layer material and its layer thickness is chosen in such a way to provide sufficient electrical insulation while not increasing the effective refractive index in regions 24a-28b and 24b-28b to exceed the effective refractive index of region 28C-30. Hence, its thickness is significantly lower than the penetration depth of the laser wavelength into the cladding layer material 28.

Cladding layer 28 of about 50-100 nm thickness is next formed over the entire insulating layer region. Again, electron beam evaporation or thermal evaporation may be applied. Cladding layer 28 is of the same material as contact layer 28c and has a number of unique criteria. First, it is non-epitaxial. Second, it has a real part of the refractive index lower than the semiconductor layers and air, and is thereby highly optically reflective at the wavelength of operation of the active layer, for example in the UV to near-IR wavelengths. Third, the material is relatively highly conductive. In one embodiment, the material may have an electrical resistivity less than 1 ohm-cm. While the actual material selected for cladding layer 32 will vary from application to application, one example which meets these criteria is metallic silver (Ag). While silver will be the focus of the following description, other materials such as indium tin oxide (ITO), silver-palladium-copper (Ag—Pd—Cu), etc. may also be employed.

Next, an opening 26 is defined by removing cladding layer material 28 and insulating material 24 using known techniques like photolithography and dry-etching such as CAIBE exposing upper waveguide layer 22. Thereby, regions 24a-28b and 24a-28b are defined.

After cleaning the surface from any previously used photoresist contact and cladding layer 28c is formed over the entire surface and on region 26 in direct physical contact with upper waveguide layer 22. The thickness of layer 28c is larger than the thickness of the insulating layer 24a and 24b but lower than the penetration depth of laser wavelength into cladding material 28. When silver is used as cladding layer, the thickness may be 10-15 nm but slightly lower or higher values are contemplated.

Due to the presence of insulating material regions 24a-28a, 24b-28b, cladding and contact layer 28 will have different heights depending on location. This configuration defines a recess 30, discussed further below, for example between 90-100 nm tall, between first and second regions 28a, 28b, and above third region 28c.

Other ways to realize a structure as described above are possible. For example, a 5-15 nm thin contact layer 28 might first be deposited over the entire surface. Next, using photolithography and etching, the so-deposited layer is removed in regions 24a and 24b. Then, insulating layers 24 and a thicker layer 28 are formed over the entire surface while region 28c is covered with a photoresist stripe. Last, the recess is formed by lift-off of the material lying over the photoresist stripe. Such procedure may have advantages for surface treatment of waveguide layer 22 prior to contact layer deposition.

It will now be appreciated that the lower and upper cladding layers are of different materials, and very likely of different thicknesses, even though the cladding pair provide waveguiding in the plane of the layers (i.e., transverse waveguiding). Accordingly, this system is referred to as an asymmetric transverse waveguide.

Focusing now on cladding and contact layer 28, optical confinement is required over the injection region to minimize optical loss. Optical confinement can be achieved if the size of the optical mode fits into the waveguide and when the index of refraction of a first material, in which the light originates, is higher than the index of all adjacent materials. For a given waveguide thickness the penetration of the optical mode into the cladding layer is a function of the refractive index step at the interface between the waveguide and the cladding layer. If this step is large, the optical mode experiences only a very small penetration into the material adjacent that in which it is generated, and low modal loss can be achieved even if the cladding material has a high extinction coefficient.

Certain materials of interest, such as silver, have a real component of the refractive index below that of most materials (semiconductors, insulators and other metals) commonly used for semiconductor laser diodes and even lower than air. Therefore, when used as cladding layer and contact layer such materials decrease the effective refractive index of the injection region relative to the laterally adjacent regions. Such a decrease may lead to lateral anti-guiding of the optical mode underneath the contact region and, hence, increase optical losses.

In the configuration illustrated in FIG. 1, the effective refractive index in recess 30 above the injection region can be increased over the adjacent regions. With air filling recess 30, the effective index of the region above the injection region (region 28c and recess 30) is greater than the index of regions 28a, 28b for wavelengths between UV and near-IR. Optical loss due to lateral mode leakage in the region below the injection region is therefore reduced.

Cladding and contact layer 28 is also intended to serve as an ohmic contact, and therefore relatively low bulk resistance is required. Certain high work-function metals are one category of materials with desirable low electrical resistance. However, most high-work-function metals (e.g., Pt, Ni) which are available for forming ohmic contact to p-type nitrides have indices of refraction which yield optically lossy interfaces. There are exceptions, such as silver, with real indices low throughout the spectrum of interest and high-work-functions which may form a low-resistance ohmic contact to p-type nitride semiconductors. Consequently, silver is one material satisfying the low optical loss, high conductivity requirements allowing it serve as both an upper cladding waveguiding layer and ohmic contact.

Figure 2:
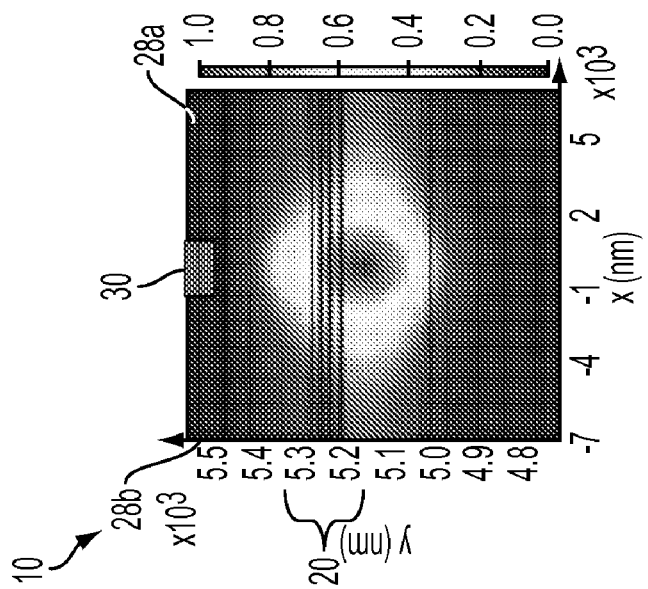
FIG. 2 is 2-dimensional mode profile model of a lasing beam emitted by a semiconductor light-emitting device as shown in FIG. 1.

With reference next to FIG. 2, there is shown therein a 2-dimensional mode profile for a nitride-based laser diode structure designed to operate at 500 nm. As can be seen the optical mode is substantially laterally confined to the region below recess 30, as well as transversely bounded by the lower and upper waveguide layers. As can be seen transverse single mode operation can be achieved for a gap width of about 2 μm.

Figure 3:
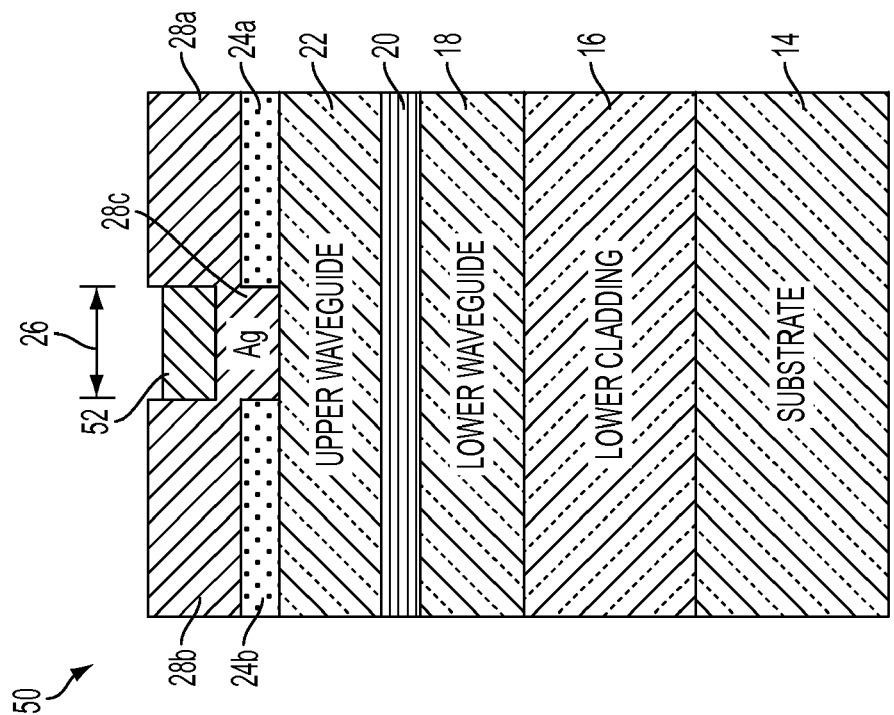
FIG. 3 is a cross-section of a semiconductor light-emitting device including a non-epitaxial, conductive layer having a recess therein over the injection region filled with an appropriate material to thereby provide a low optical loss region and permit the non-epitaxial layer to function both as a lateral waveguide and as an ohmic contact according to a second embodiment of the present invention.
Figure 5:
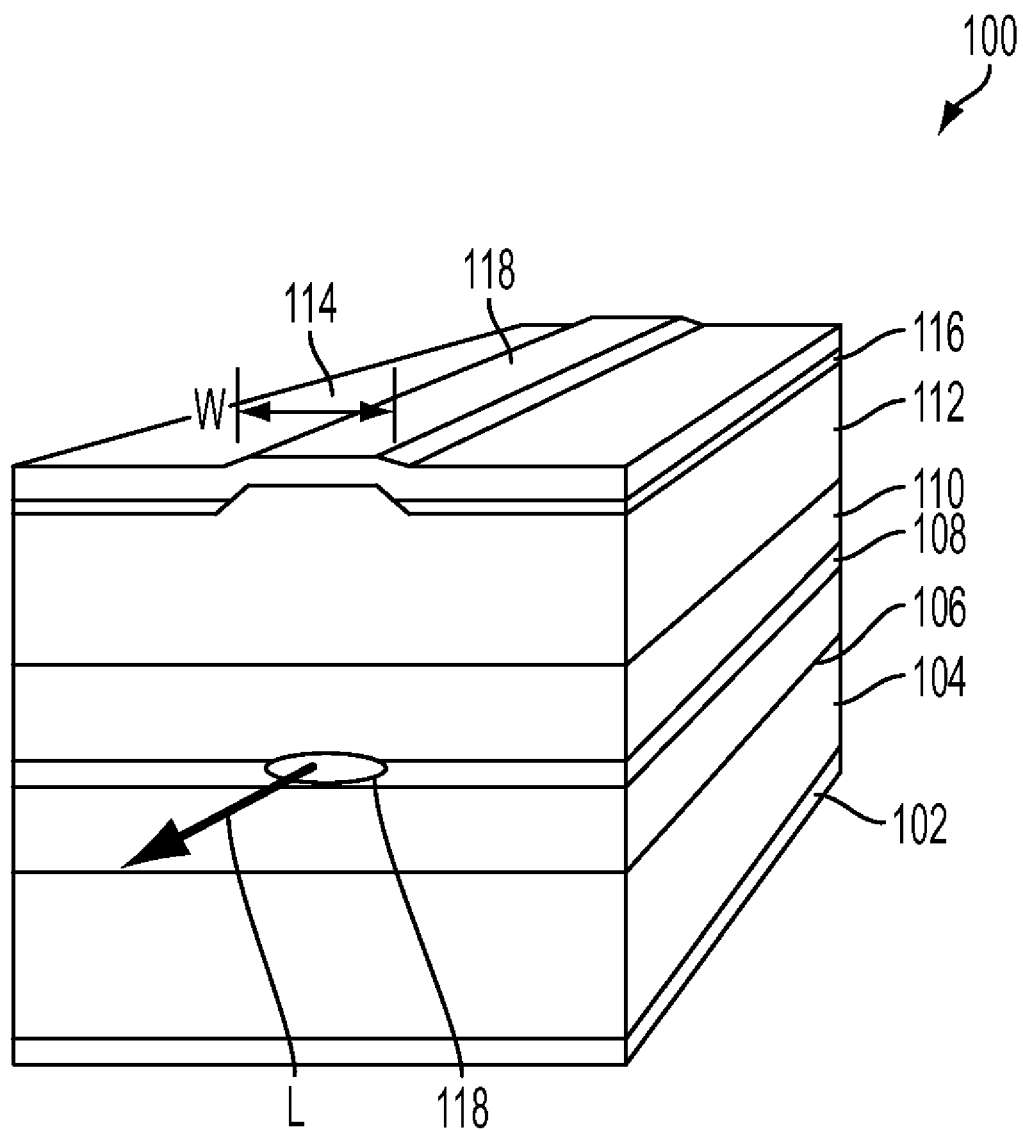
FIG. 5 is a cross-section of a ridge-waveguide semiconductor light-emitting device known in the art.

According to a second embodiment 50 of the present disclosure, shown in FIG. 3, recess 30 is filled with a conductive, low-loss material 52 having a refractive index higher than that of the material forming cladding and contact layer 28 but lower than that of waveguide layer 22. Many materials such as transparent conductive oxides (e.g., indium tin oxide (ITO), zinc oxide (ZnO), etc.), appropriate metal (e.g., gold), or a composite comprising a conductive oxide and a metal, provide low absorption in the UV and near-IR wavelengths, are conductive, and thus may be selected for filling in recess 30. This embodiment provides low ohmic contact resistance over the injection region of the semiconductor laser device as well as good thermal dispersion for heat dissipation.

Figure 4:
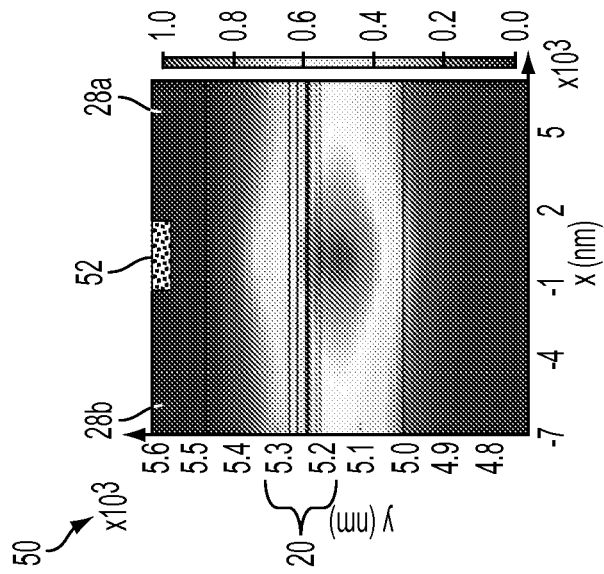
FIG. 4 is 2-dimensional mode profile model of a lasing beam emitting by a semiconductor light-emitting device as shown in FIG. 3.

With reference next to FIG. 4, there is shown therein a 2-dimensional mode profile for a nitride-based laser diode structure designed to operate at 500 nm. As can be seen the optical mode is substantially laterally confined to the region below region 28c and material 52 filling recess 30, as well as transversely bounded by the lower and upper waveguide layers. As can be seen transverse single mode operation can be achieved for a gap width of about 2 μm. The lower lateral guiding as compared to the example illustrated in FIG. 2 is due to the relatively lower index step between the gap region and the adjacent regions. Otherwise, better thermal and electrical conductivity in the gap region may be achieved. Furthermore, the ellipticity of the transverse mode profile can be shaped using a second material as gap filler.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-page disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below. For example, the description above has been of the InGaN system. However, other semiconductor material systems such as (In,Al,Ga)(As,P)/GaAs, (In,Ga,Al)(As,P)/InP, and (In,Ga,Al)(As,P)/GaP, etc. can be used to manufacture laser structures as outlined above and for which the teachings hereof may apply.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A combined ohmic contact and lateral waveguide for a semiconductor light-emitting device, said combined ohmic contact and lateral waveguide formed over a patterned insulating material layer defining a gap therein in a region over a portion of an active layer forming an injection region, comprising:
    a non-epitaxial, conductive contact and waveguide layer having a plurality of regions, comprising:
        first and second regions formed over said patterned insulating material, each said first and second regions having an upper surface in a first plane;
        a third region in physical contact with said first and second regions and formed over said gap, said third region having an upper surface in a second plane displaced from said first plane so as to define a recess located between said first and second regions and above said third region;
    whereby, said non-epitaxial contact and waveguide layer functions both as an ohmic contact and as a lateral waveguide for the semiconductor light-emitting device and wherein said non-epitaxial contact and waveguide layer has an electrical resistivity less than 1 ohm-cm; and
    further whereby said recess is substantially free of any material other than ambient air.

2. The combined ohmic contact and lateral waveguide of claim 1, wherein said non-epitaxial contact and waveguide layer includes at least one material selected from the group consisting of: silver (Ag), indium tin oxide (ITO), and silver-palladium-copper (Ag—Pd—Cu).

3. A semiconductor light-emitting device, comprising:
    a substrate;
    a crystalline semiconductor cladding layer formed over said substrate;
    a lower waveguide formed over said crystalline semiconductor cladding layer;
    an active layer formed over said lower waveguide;
    an upper waveguide formed over said active layer;
    a patterned insulating layer formed over said upper waveguide, said patterned insulating defining a gap therein in a region over a portion of said active layer forming an injection region; and
    a non-epitaxial cladding layer formed over said patterned insulating layer and said gap such that:
        first and second regions of said non-epitaxial cladding layer are in physical contact with material forming said patterned insulating layer; and
        a third region of said non-epitaxial cladding layer is in physical and electrical contact with said upper waveguide in said gap defined by said patterned insulating layer; and
        said first and second regions have an upper surface in a first plane, said third region has an upper surface in a second plane displaced from said first plane so as to define a recess located between said first and second regions and above said third region;
    whereby, said non-epitaxial cladding layer functions both as an ohmic contact and as a lateral waveguide for the semiconductor light-emitting device; and
    further whereby said recess is substantially free of any material other than ambient air.

4. The semiconductor light-emitting device of claim 3, wherein said non-epitaxial cladding layer has an electrical resistivity less than 1 ohm-cm.

5. The semiconductor light-emitting device of claim 3, wherein said non-epitaxial cladding layer is comprised substantially of silver (Ag).

* * * * *